US012604603B2

(12) United States Patent　　　(10) Patent No.:　US 12,604,603 B2

Kitamura　　　　　　　　　　　　　(45) Date of Patent:　Apr. 14, 2026

(54) LIGHT-EMITTING ELEMENT AND DISPLAY DEVICE

(71) Applicant: SHARP KABUSHIKI KAISHA, Sakai City (JP)

(72) Inventor: Ryo Kitamura, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 667 days.

(21) Appl. No.: 17/918,889

(22) PCT Filed: Apr. 22, 2020

(86) PCT No.: PCT/JP2020/017323

§ 371 (c)(1),
(2) Date: Oct. 13, 2022

(87) PCT Pub. No.: WO2021/214910

PCT Pub. Date: Oct. 28, 2021

(65) Prior Publication Data

US 2023/0292538 A1　　Sep. 14, 2023

(51) Int. Cl.
*H10K 50/16*　　　(2023.01)
*H10K 50/115*　　(2023.01)
(Continued)

(52) U.S. Cl.
CPC ......... *H10K 50/166* (2023.02); *H10K 50/115* (2023.02); *H10K 50/156* (2023.02); *H10K 2101/30* (2023.02)

(58) Field of Classification Search
CPC ........ H10K 50/11; H10K 50/15; H10K 50/16; H10K 50/171; H10K 2101/30; H10K 2101/40; H10K 2102/351; H10K 50/852; H10K 59/35; H10K 59/12; H10K 50/156; H10K 2101/00; H10K 50/844; H10K 59/131; H10K 77/111; H10K 50/805; H10K 50/856; H10K 50/8445; H10K 50/85; H10K 59/10; H10K 59/129; H10K 2102/311;
(Continued)

(56) References Cited

U.S. PATENT DOCUMENTS 10,600,980 B1 * 3/2020 Boardman ........... H10K 59/877
2017/0244059 A1 * 8/2017 Sasaki ................... H10K 50/17
(Continued)

FOREIGN PATENT DOCUMENTS

JP　　2005235564 A　　9/2005
JP　　2012146764 A　　8/2012
(Continued)

*Primary Examiner* — Moin M Rahman
(74) *Attorney, Agent, or Firm* — ScienBiziP, P.C.

(57) ABSTRACT

A light-emitting element according to an aspect of the disclosure, comprising: a first electrode; a second electrode; a light-emitting layer disposed between the first electrode and the second electrode; and a charge transport layer disposed between the first electrode and the light-emitting layer. The charge transport layer includes a first layer and a second layer closer to the first electrode relative to the first layer. The first layer and the second layer include nanoparticles containing an identical semiconductor A particle size of the nanoparticle of the second layer is larger than a particle size of the nanoparticle of the first layer.

4 Claims, 12 Drawing Sheets

(51) Int. Cl.
*H10K 50/15*           (2023.01)
*H10K 101/30*          (2023.01)

(58) Field of Classification Search
CPC ............. H10K 2102/361; H10K 71/00; H10K 85/615; H10K 85/624; H10K 85/626; H10K 85/631; H10K 85/633; H10K 85/636; H10K 85/6572; H10K 50/155; H10K 50/115; H10K 50/13; H10K 50/80; H10K 85/6574; H10K 50/166; H10K 2102/331; B60K 37/02; B60K 2370/1523; B60K 2370/331; B60K 2370/52; B60R 1/00; G02F 1/133305; G02F 1/133388; G02F 1/13452; G02F 1/136254; G02F 2201/50; G02F 2202/28; H01L 2224/73204; Y02E 10/549; G09G 2300/0426; H05B 33/14

See application file for complete search history.

(56)                    References Cited

U.S. PATENT DOCUMENTS

| | | | |
|---|---|---|---|
| 2017/0288154 A1* | 10/2017 | Seo ...................... | H10K 85/342 |
| 2019/0006541 A1* | 1/2019 | So ........................ | H10K 30/353 |
| 2020/0075897 A1 | 3/2020 | Tanaka | |
| 2021/0020838 A1* | 1/2021 | Qin ....................... | C09K 11/06 |
| 2021/0057168 A1 | 2/2021 | Shiomi et al. | |
| 2022/0109129 A1 | 4/2022 | Tanaka | |

FOREIGN PATENT DOCUMENTS

| | | | |
|---|---|---|---|
| JP | 2020035942 A | 3/2020 | |
| WO | 2012161179 A1 | 11/2012 | |
| WO | 2019150989 A1 | 8/2019 | |

* cited by examiner (a)
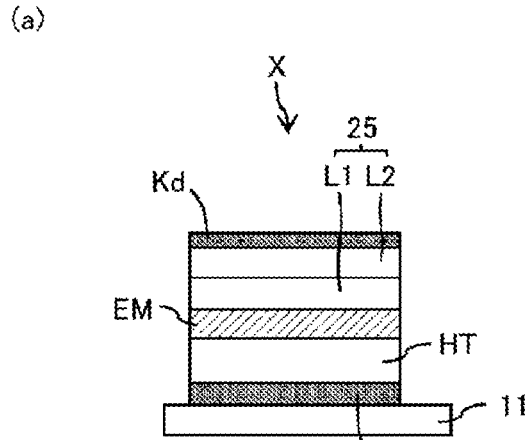
(b)
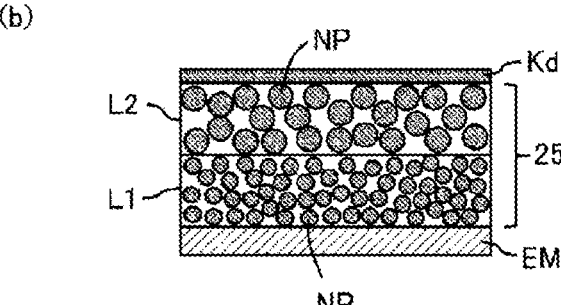
(c)
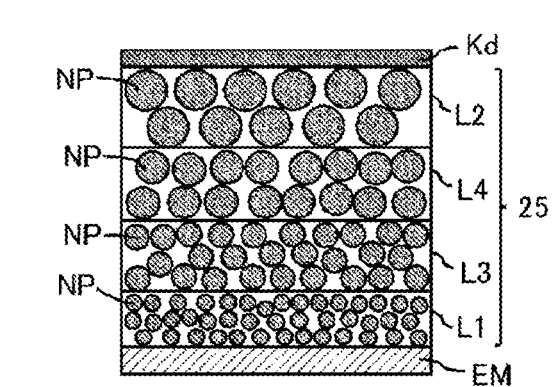
FIG. 1

(a)
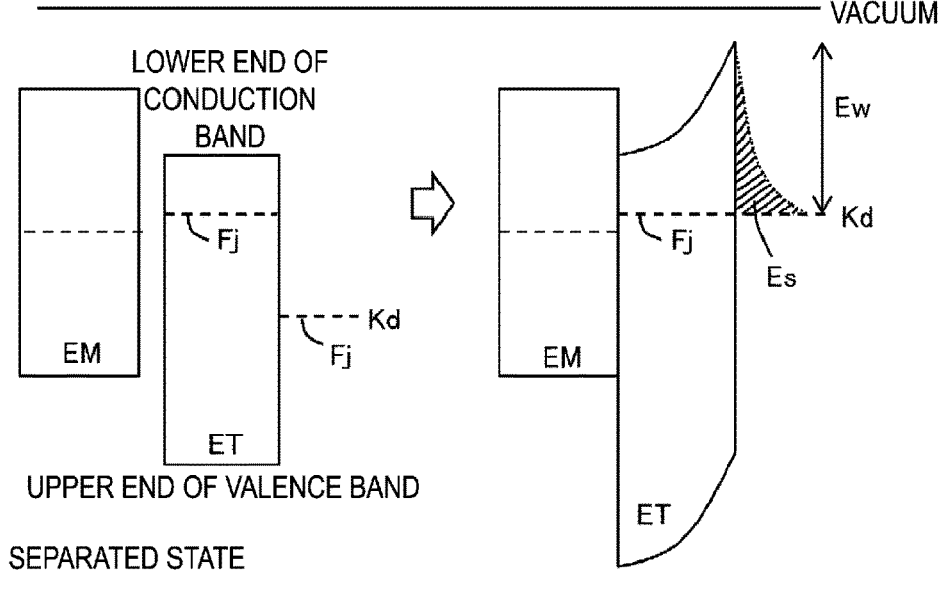
(b)
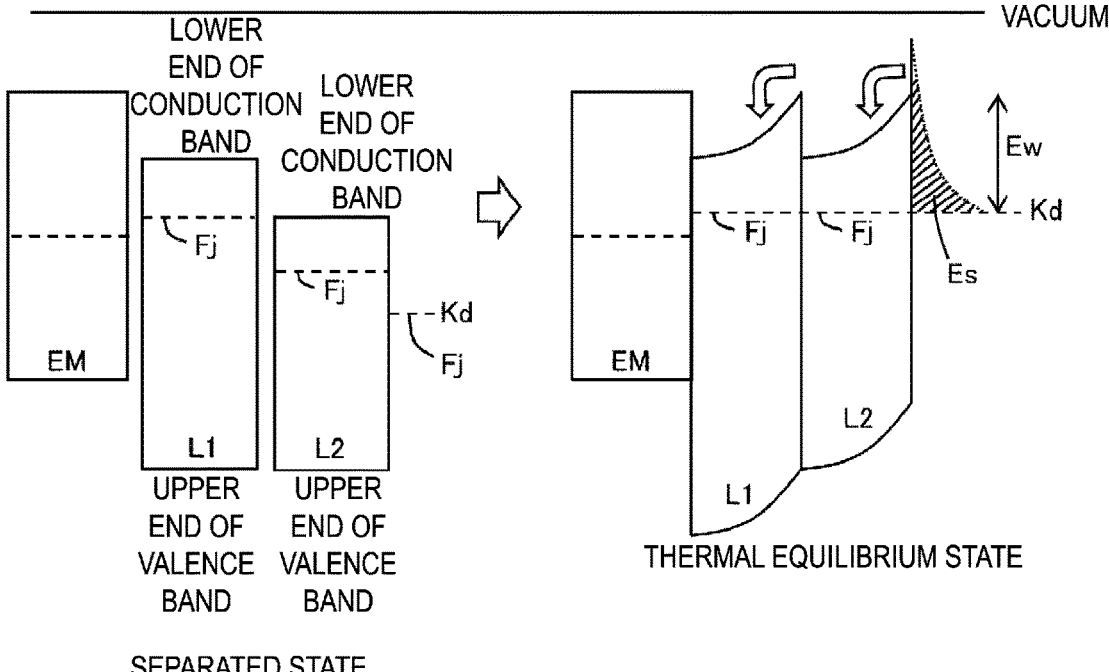
FIG. 2

(a)
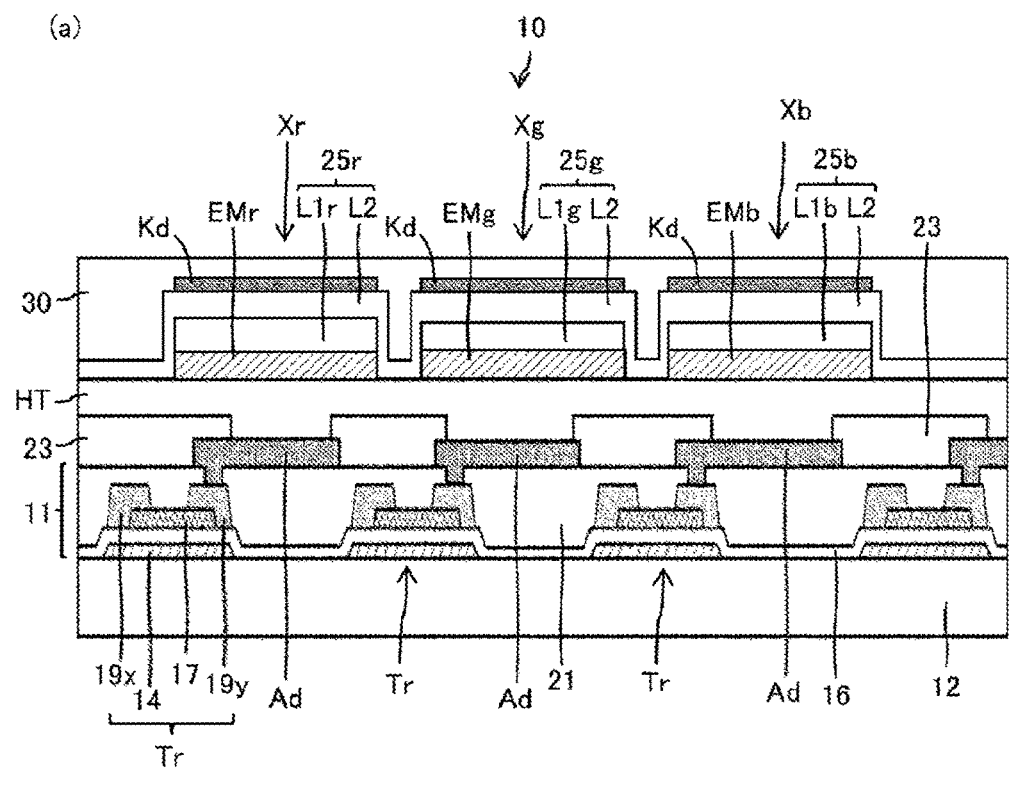
(b)          (c)
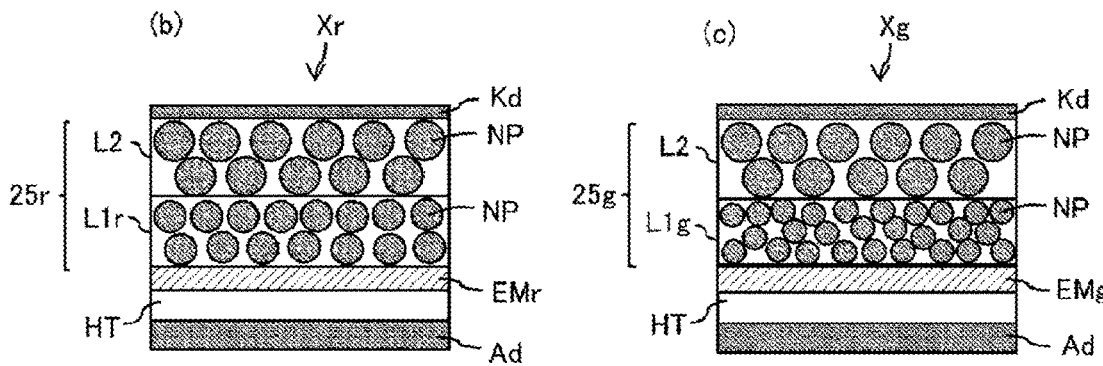
(d)
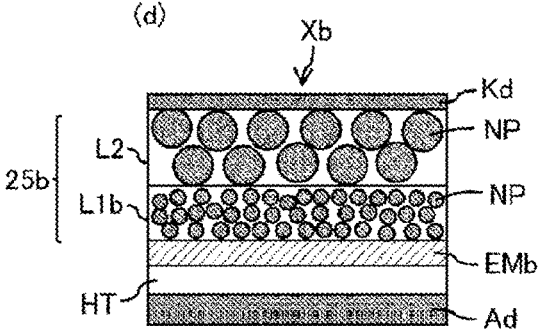
FIG. 6

| LIGHT-EMITTING ELEMENT | Xr (RED) | Xg (GREEN) | Xb (BLUE) |
|---|---|---|---|
| MATERIAL OF LIGHT-EMITTING LAYER | CADMIUM SELENIUM (CdSe) | | |
| QUANTUM DOT SIZE OF LIGHT-EMITTING LAYER | LARGE | MEDIUM | SMALL |
| CBM OF LIGHT-EMITTING LAYER (LEVEL OF LOWER END OF CONDUCTION BAND) | -3.4eV | -3.1eV | -2.7eV |
| MATERIAL OF ELECTRON TRANSPORT LAYER (ET) | ZnO NANOPARTICLE | | |
| ZnO PARTICLE SIZE OF FIRST LAYER OF ET (LIGHT-EMITTING LAYER SIDE) | 1.7nm | 1.4nm | 1.15nm |
| ZnO PARTICLE SIZE OF SECOND LAYER OF ET (CATHODE SIDE) | 10nm(CBM:-4.0eV) | | |
| CATHODE MATERIAL | Al (FERMI LEVEL: -4.3 eV) | | |

FIG. 7

(a)
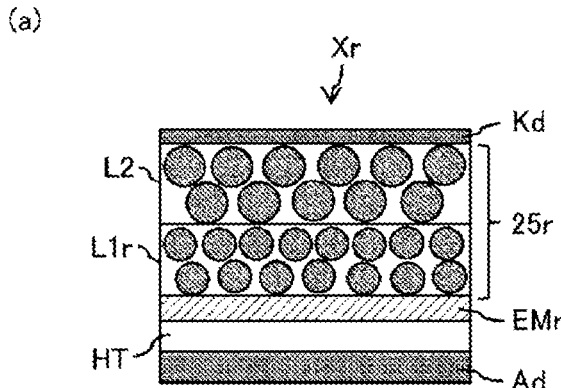
(b)
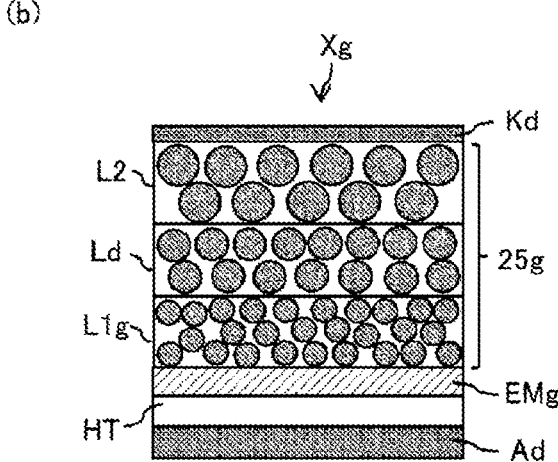
(c)
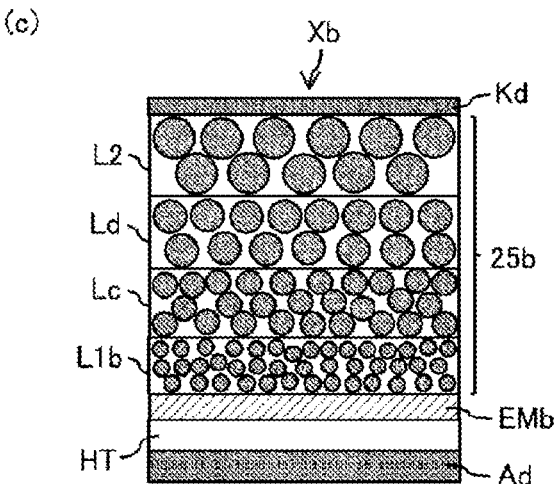
FIG. 8

(a)
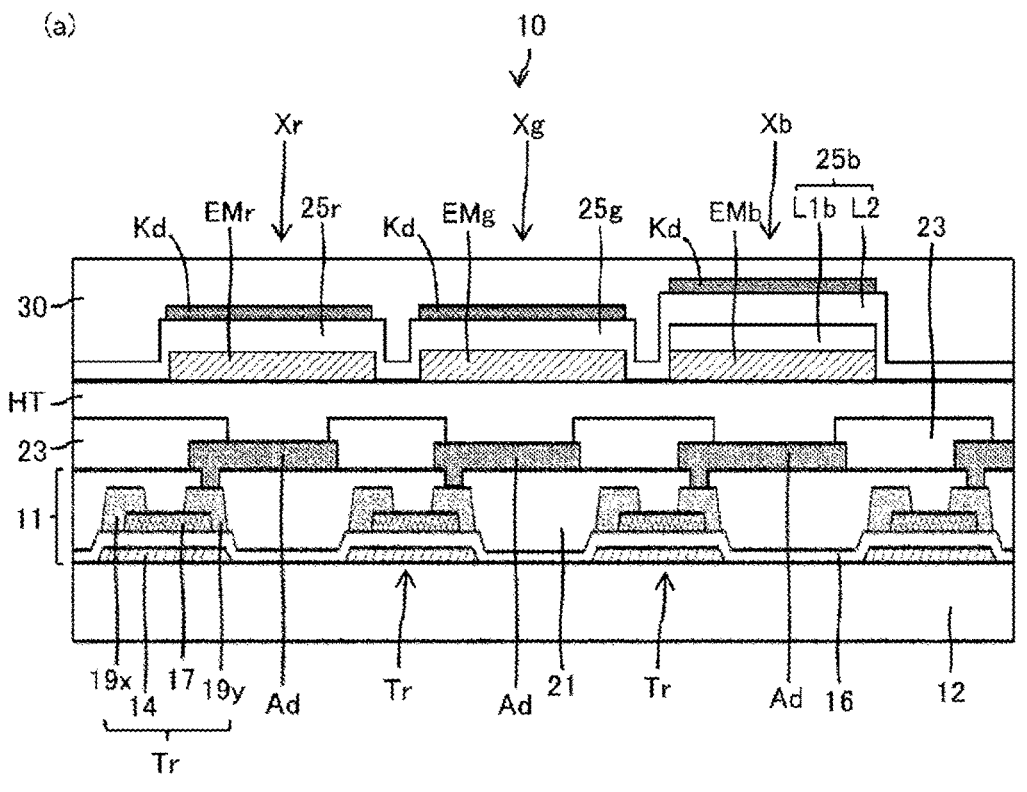
(b)
(c)
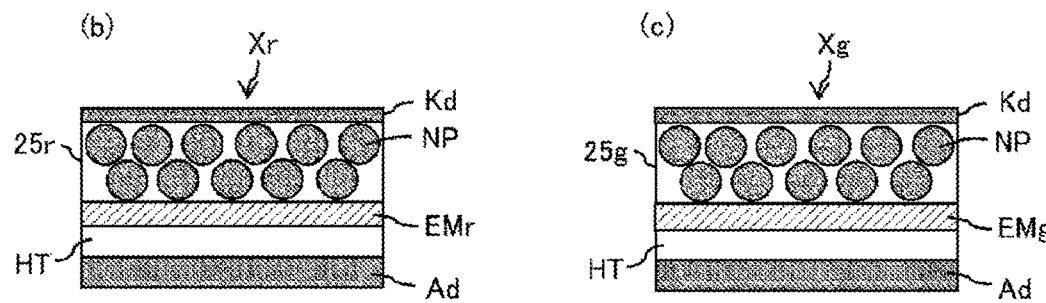
(d)
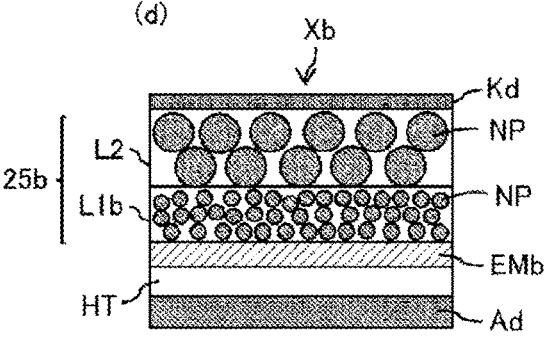
FIG. 9

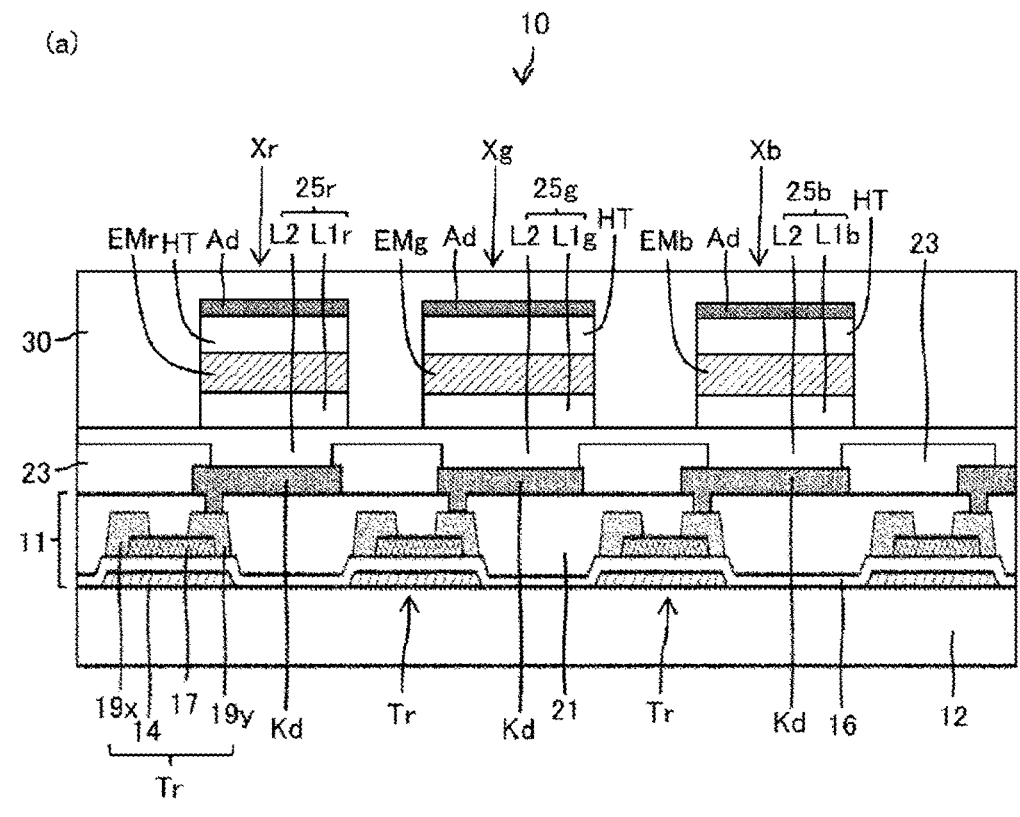
(a)
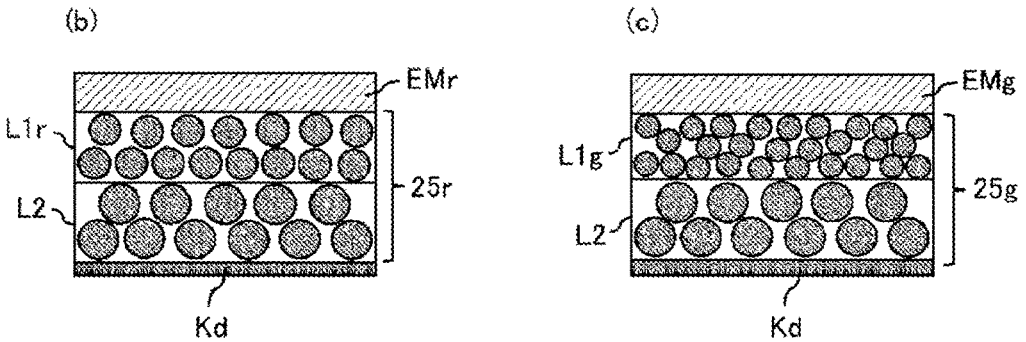
(b)     (c)
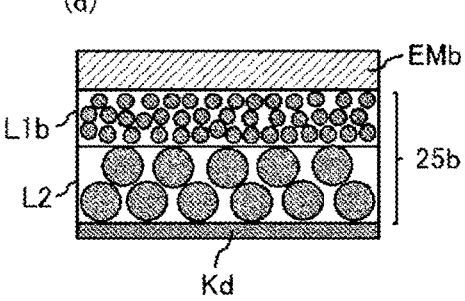
(d)
FIG. 10

(a)
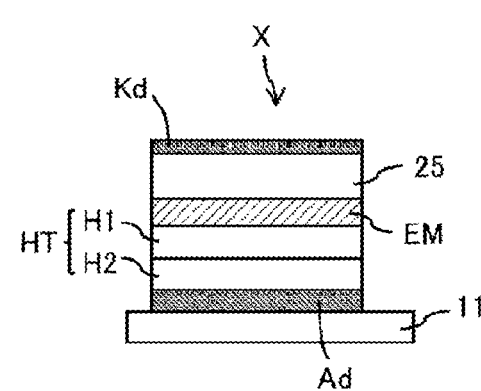
(b)
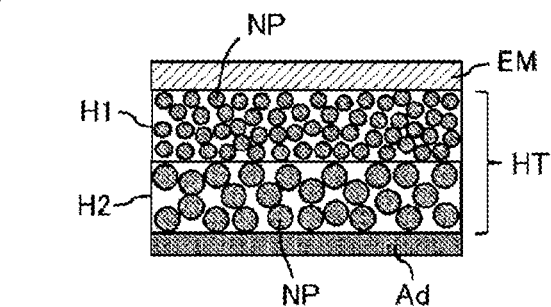
(c)
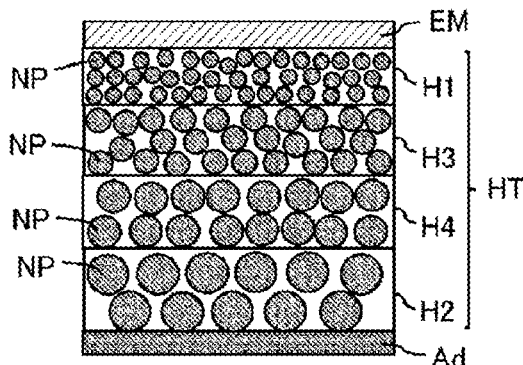
FIG. 11

LIGHT-EMITTING ELEMENT AND DISPLAY DEVICE

TECHNICAL FIELD

The disclosure relates to a light-emitting element and a display device.

BACKGROUND ART

PTL 1 discloses a light-emitting element including a light-emitting layer containing luminescent body particles and an electron transport layer containing inorganic nanoparticles.

CITATION LIST

Patent Literature

PTL 1: WO 2012/161179

SUMMARY

Technical Problem

In the light-emitting element of PTL 1, when a light-emitting layer with the level of a lower end of a conduction band being shallow and an electron transport layer containing inorganic nanoparticles having a small particle size are combined, there arises a problem that an interface barrier of a cathode and the electron transport layer becomes large so that electron injection efficiency being degraded.

Solution to Problem

A light-emitting element according to an aspect of the disclosure includes a first electrode; a second electrode; a light-emitting layer disposed between the first electrode and the second electrode; and a charge transport layer disposed between the first electrode and the light-emitting layer. The charge transport layer includes a first layer and a second layer closer to the first electrode relative to the first layer. The first layer and the second layer include nanoparticles containing an identical semiconductor. A particle size of the nanoparticle of the second layer is larger than a particle size of the nanoparticle of the first layer.

Advantageous Effects of Disclosure

According to an aspect of the disclosure, the interface barrier of the cathode and the electron transport layer becomes small, and the electron injection efficiency is improved.

BRIEF DESCRIPTION OF DRAWINGS

FIG. 1(a) is a cross-sectional view illustrating a configuration of a light-emitting element of a first embodiment, and FIGS. 1(b) and 1(c) are cross-sectional views each illustrating a configuration of an electron transport layer of the light-emitting element.

FIG. 2(a) is an energy level diagram of a comparative example, and FIG. 2(b) is an energy level diagram of the first embodiment.

FIG. 6(a) is a cross-sectional view illustrating the configuration of the display device of Example 1, and FIGS. 6(b) to 6(d) are cross-sectional views each illustrating a configuration of an electron transport layer of a light-emitting element.

FIG. 7 is a table showing a configuration example of Example 1.

FIG. 8 illustrates cross-sectional views depicting a modified example of Example 1.

FIG. 9(a) is a cross-sectional view illustrating a further modified example of Example 1, and FIGS. 9(b) to 9(d) are cross-sectional views each illustrating a configuration of an electron transport layer of a light-emitting element.

FIG. 10(a) is a cross-sectional view illustrating a further modified example of Example 1, and FIGS. 10(b) to 10(d) are cross-sectional views each illustrating a configuration of an electron transport layer of a light-emitting element.

FIG. 11(a) is a cross-sectional view illustrating a configuration of a light-emitting element of a second embodiment, and FIGS. 11(b) and 11(c) are cross-sectional views each illustrating a configuration of an electron transport layer of the light-emitting element.

DESCRIPTION OF EMBODIMENTS

First Embodiment

Figure 3:
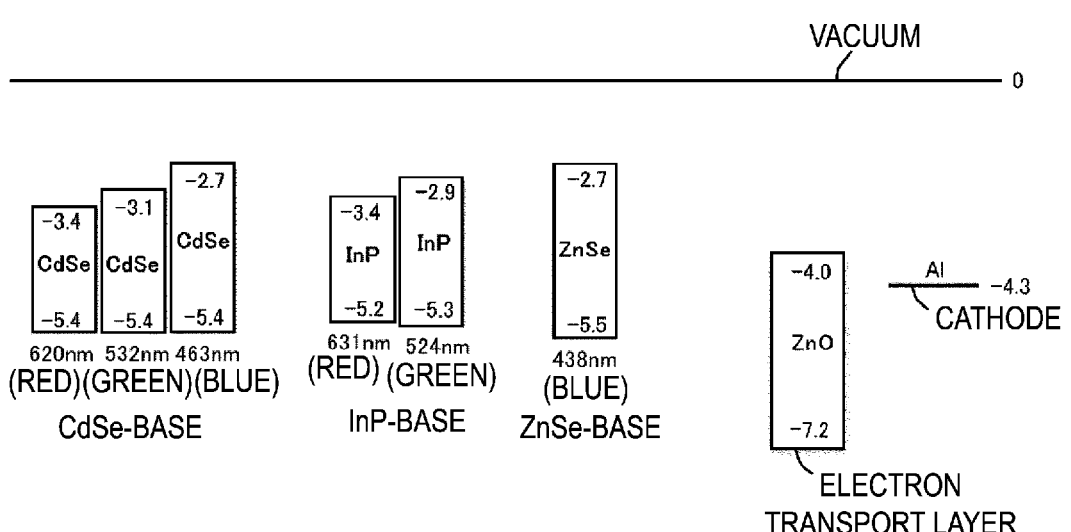
FIG. 3 is a schematic view illustrating light-emitting wavelengths and band gaps of various light-emitting materials.

FIG. 1(a) is a cross-sectional view illustrating a configuration of a light-emitting element of a first embodiment, and FIGS. 1(b) and 1(c) are cross-sectional views each illustrating a configuration of an electron transport layer of the light-emitting element. As illustrated in FIGS. 1(a) to 1(c), a light-emitting element X of the first embodiment includes an anode Ad as a first electrode, a cathode Kd as a second electrode, a light-emitting layer EM disposed between the anode Ad and the cathode Kd, and an electron transport layer 25 as a charge transport layer disposed between the cathode Kd and the light-emitting layer EM. The electron transport layer 25 includes a first layer L1 and a second layer L2 closer to the cathode Kd relative to the first layer L1, the first layer L1 and the second layer L2 include nanoparticles NP formed of the same semiconductor, and a particle size of the nanoparticle NP of the second layer L2 is larger than a particle size of the nanoparticle NP of the first layer L1. In other words, the electron transport layer 25 is provided with a plurality of layers of L1 to L4 including the first layer L1 and the second layer L2, each of the plurality of layers includes the nanoparticles NP formed of the same semiconductor, and the layer closer to the cathode Kd includes the nanoparticle NP of a larger particle size.

In the semiconductor nanoparticles (particles of the order of nanometers in size) NP, the quantum size effect occurs as the particle size decreases, and an effect of an increase in band gap is obtained. In many of the oxide semiconductor nanoparticles NP, since the effective mass of an electron is small compared to a positive hole, a level change (change toward a shallower level) of the lower end of the conduction band is larger than a level change (change toward a deeper level) of the upper end of the valence band when the particle size is reduced to increase the band gap. Because of this, it is useful to apply a semiconductor to the electron transport layer and change the particle size of the nanoparticle, for adjusting the electron injection level and the Fermi level. The same semiconductor mentioned above also includes a semiconductor having a margin of about 10% impurity (a degree of a composition error that does not affect the band level). For example, as for the semiconductor ZnO, a semiconductor whose composition is ZnO to $Zn_{0.9}M_{0.1}O$ is also taken as the same semiconductor, as for the semiconductor $TiO_2$, a semiconductor whose composition is $TiO_2$ to $Ti_{0.9}M_{0.1}O_2$ is also taken as the same semiconductor, and as for the semiconductor $ZrO_2$, a semiconductor whose composition is $ZrO_2$ to $Zr_{0.9}M_{0.1}O_2$ is also taken as the same semiconductor.

In relation to the Fermi level accompanying the particle size change, it is unlikely that the quantity of donors changes significantly caused by the particle size change. Because of this, a difference between the level of the lower end of the conduction band and the Fermi level may be considered substantially constant, where the difference is a factor that determines the carrier density. Accordingly, the Fermi level may be considered to become shallower at the same energy width as the level change of the lower end of the conduction band accompanying the decrease of the particle size.

As a material of the nanoparticle NP of the electron transport layer 25, a material in which the effective mass of a positive hole is larger than that of an electron in the bulk state is suitable, and an oxide containing at least one of Zn, Ti, Sn, and Zr is preferable. Specifically, among the semiconductors, ZnO as a group II-VI compound having an ionic bond, a compound containing this, and the like are desirable. Materials other than the above materials may be $TiO_2$, $ZrO_2$, and $SnO_2$. Furthermore, the semiconductor as a material of the nanoparticle NP of the electron transport layer 25 may be the oxide further containing at least one of Al, In, and Mg.

Based on the quantum size effect as discussed above, to obtain an increase in the level of the lower end of the conduction band and an increase in the Fermi level by the particle size change of the nanoparticles constituting the electron transport layer 25, it is desirable for the diameter of the nanoparticle NP to be 10 nm or less, more preferably 5 nm or less.

In principle, as the particle size is smaller, the level of the lower end of the conduction band and the Fermi level can be made shallower, but it is desirable for the diameter to be not less than 1 nm due to the manufacturing restrictions in an attempt to cause the particle size distribution of the nanoparticles NP to fall within a practical range.

The level of an upper end of a valence band of the electron transport layer 25 is substantially constant or becomes deeper as the band gap increases due to the reduction in particle size, and thus the positive holes injected from a hole transport layer HT into the light-emitting layer EM may be efficiently confined in the light-emitting layer EM by disposing the nanoparticles NP having a small particle size on the light-emitting layer EM side. In the light-emitting layer EM, the positive holes and electrons recombine when a current flows between the anode Ad and the cathode Kd, and light is emitted while an exciton generated by the recombination transitions from the conduction band level to the valence band level of the quantum dot.

FIG. 2(*a*) is an energy level diagram of a comparative example, and FIG. 2(*b*) is an energy level diagram of the first embodiment. In the energy level diagram, the energy state is described based on the vacuum level, and the upper side of the frame indicating the band gap indicates a level of the lower end of the conduction band, and the lower side thereof indicates a level of the upper end of the valence band.

As illustrated in FIG. 2(*a*), when the cathode Kd, an electron transport layer ET, and the light-emitting layer EM are bonded, the band bends to match Fermi levels Fj of the electron transport layer ET (for example, ZnO) and the cathode Kd. At this time, the height of a barrier between the cathode Kd and the electron transport layer ET is a difference between the level of the lower end of the conduction band of the electron transport layer ET and a work function of the cathode Kd. Not all of the electrons of the cathode Kd have a single energy level, and the electrons thereof actually have an exponential function-type energy distribution Es due to the effect of heat. In a comparative example (see FIG. 2(*a*)) in which the particle size of the nanoparticles in the electron transport layer ET is uniformed, because the barrier between the cathode Kd and the electron transport layer ET is too high for the energy distribution Es of the electrons in the cathode Kd, the electrons hardly move.

On the other hand, in FIG. 2(*b*), in a state in which the first layer L1 and the second layer L2 are separated, a difference between the level of the upper end of the valence band of the first layer L1 and the level of the lower end of the conduction band of the first layer L1 is greater than a difference between the level of the upper end of the valence band of the second layer L2 and the level of the lower end of the conduction band of the second layer L2. In the state in which the first layer L1 and the second layer L2 are separated, the level of the lower end of the conduction band of the first layer L1 is shallower than the level of the lower end of the conduction band of the second layer L2, and the level of the upper end of the valence band of the first layer L1 is equivalent to the level of the upper end of the valence band of the second layer L2. In the state in which the first layer L1 and the second layer L2 are separated, the Fermi level Fj of the first layer L1 is shallower than the Fermi level Fj of the second layer L2. When the bonded first and second layers L1 and L2 are in a thermal equilibrium state, the Fermi level Fj of the first layer L1 and the Fermi level Fj of the second layer L2 match each other. When the bonded first and second layers L1 and L2 are in the thermal equilibrium state, the level of the upper end of the valence band of the first layer L1 is deeper than the level of the upper end of the valence band of the second layer L2. With regard to bonding the light-emitting layer EM and the electron transport layer 25, because electrical conductivity of a quantum dot layer is significantly low, electrons and positive holes are unlikely to flow into the quantum dot layer, so that the Fermi levels Fj are not matched, and the bonding is made at a level as it is. At this time, the barrier from the electron transport layer 25 to the light-emitting layer EM is a difference between a LUMO of the light-emitting layer EM and a level of the lower end of the conduction band of the electron transport layer ET or the first layer L1 in a state before bonding.

In FIG. 1(*b*) and FIG. 2(*b*), the electron transport layer 25 is provided with the first layer L1 including the semiconductor nanoparticles NP, and the second layer L2 located on the cathode side relative to the first layer L1 and including the semiconductor nanoparticles NP having a larger particle size than that of the first layer L1 (having a smaller band gap than the first layer L1), and thus an interlayer barrier becomes small and the quantity of electrons injected from the cathode Kd into the electron transport layer 25 is increased as compared to the case of FIG. 2(*a*) of the comparative example. In other words, the electron injection efficiency is improved.

In FIG. 1(c), the light-emitting layer EM, the first layer L1, the third layer L3 including the semiconductor nanoparticles, the fourth layer L4 including the semiconductor nanoparticles, the second layer L2, and the cathode Kd are disposed in that order, and a relation of the particle size of the first layer L1<the particle size of the third layer L3<the particle size of the fourth layer L4<the particle size of the second layer L2 is satisfied. As described above, as the number of layers in the electron transport layer 25 is increased, the interlayer barrier becomes smaller, so that transport properties of the electrons in the electron transport layer 25 are improved and the electron injection efficiency is improved.

FIG. 3 is a schematic view illustrating light-emitting wavelengths and band gaps of various light-emitting materials. As illustrated in FIG. 3, a work function of aluminum (Al), which is one of the cathode materials, is −4.3 eV, and a level of the lower end of the conduction band of a layer of ZnO nanoparticles with a particle size of approximately 12 nm is −4.0 eV. In contrast, the lower end of the conduction band of the light-emitting layer including CdSe-based quantum dots is at −3.4 to −2.7 eV, and the lower end of the conduction band of the light-emitting layer including Cd-free InP-based and ZnSe-based quantum dots is at −3.4 to −2.7 eV, so that it may be understood that these lower ends of the conduction bands are at shallow levels compared to the level of the conduction band bottom of the ZnO nanoparticle layer (Φ=12 nm). Note that in FIG. 3, the band level indicates the value of the core. In general, quantum dots used as light-emitting materials form a shell outside the core in many cases to protect the core and to obtain a confining effect to cause a pair of an electron and a positive hole injected to recombine for light emission at the core, and this shell is thin enough to inject the electrons and positive holes by tunneling with respect to the quantum dots. Due to this, when considering charge injection to the quantum dots, it is allowed to ignore the band level of the shell.

Figure 4:
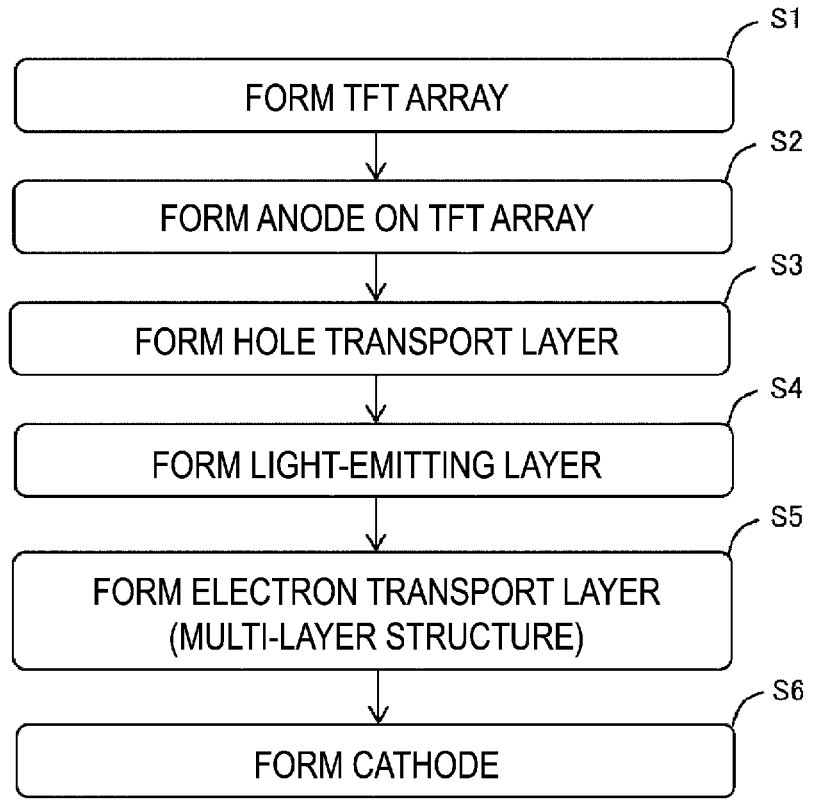
FIG. 4 is a flowchart illustrating an example of a method for manufacturing a light-emitting element.

FIG. 4 is a flowchart illustrating an example of a method for manufacturing a light-emitting element. In step S1 of FIG. 4, a thin film transistor (TFT) array substrate 11 including a plurality of TFTs is formed. In step S2, the anode Ad is formed on the TFT array substrate 11 by using sputtering, vapor deposition, or the like. Examples of the anode material include Indium Tin Oxide (ITO), Ag, Al, Mg, LiF, and a reductant of an oxide semiconductor. In step S3, the hole transport layer HT is formed on the anode Ad by using an application method, sputtering, vapor deposition, or the like. A known hole transport-property organic material (TFB, PEDOT, or the like) and a known hole transport-property inorganic material ($La_2O_3$, NiO, $MoO_3$, $WO_3$, or the like) may be used for the hole transport layer HT.

In step S4, the light-emitting layer EM is formed on the hole transport layer HT by using an application method, vapor deposition, or the like. The material of the light-emitting layer is an organic light-emitting material applied to an organic light-emitting diode (OLED), an inorganic light-emitting material applied to a quantum dot (QD), or the like. When the inorganic light-emitting material is used, a colloid- or resist-dispersed solution may be applied and then a photolithography method may be used for patterning, or coating by an ink-jet method may be applied.

In step S5, the electron transport layer 25 is formed on the light-emitting layer EM. Specifically, at least two layers of the nanoparticle layers each formed of the same material (semiconductor) and having a different particle size are layered in such a manner that the particle size becomes smaller from the cathode side toward the light-emitting layer side, thereby forming the electron transport layer 25. Each nanoparticle layer is formed by sequentially applying a colloidal solution containing electron transportability nanoparticles and volatilizing the solvent. By doing so, the electron transport layer 25 is constituted in such a manner that the band gap is larger, and the level of the lower end of the conduction band and the Fermi level are shallower from the cathode Kd toward the light-emitting layer EM, so that the electron transport and injection from the cathode Kd to the light-emitting layer EM may be efficiently performed.

The electron transport material is preferably a semiconductor with positive holes having large effective mass. Among the semiconductors, ZnO, $TiO_2$, $ZrO_2$, $SnO_2$, and the like having a large electron affinity and a large ionization potential are preferable. Al, Mg, or In may be added to the above-mentioned materials to adjust the electrical conductivity, electron affinity, and ionization potential.

The film thickness of the electron transport layer 25 is preferably in a range from 10 nm to 200 nm. According to the experiments by the inventors, in a case where the light-emitting layer EM is made to be a quantum dot layer, the size of surface irregularities between the deepest and shallowest portions is approximately 10 nm, and therefore there is a possibility that the light-emitting layer EM and the cathode Kd are short-circuited when the film thickness of the electron transport layer is less than or equal to 10 nm.

A case where the thickness of the electron transport layer 25 exceeds 200 nm is unfavorable because the voltage and power consumption increase due to the increase of series resistance, thereby increasing the generation of heat that causes the degradation in power conversion efficiency and affects the long-term reliability.

It is desirable that the particle size of each nanoparticle layer be in a range from 1 nm to 5 nm in diameter on the side in contact with the light-emitting layer EM, and in a range from 3 nm to 100 nm in diameter on the side in contact with the cathode Kd.

It is allowed that the layer in contact with the cathode Kd in the electron transport layer 25 does not have a nanoparticle structure and is made of an amorphous thin film formed by vapor deposition or the like. For example, the second layer L2 in FIG. 1(c) may be replaced with an amorphous ZnO film. In this case, the level of the lower end of the conduction band of the amorphous ZnO film is approximately −4.0 to 4.2 eV.

In step S6, the cathode Kd is formed on the electron transport layer 25 by using sputtering, vapor deposition, or the like. As the cathode material, for example, Al, Mg, or Ag may be used.

Example 1

Figure 5:
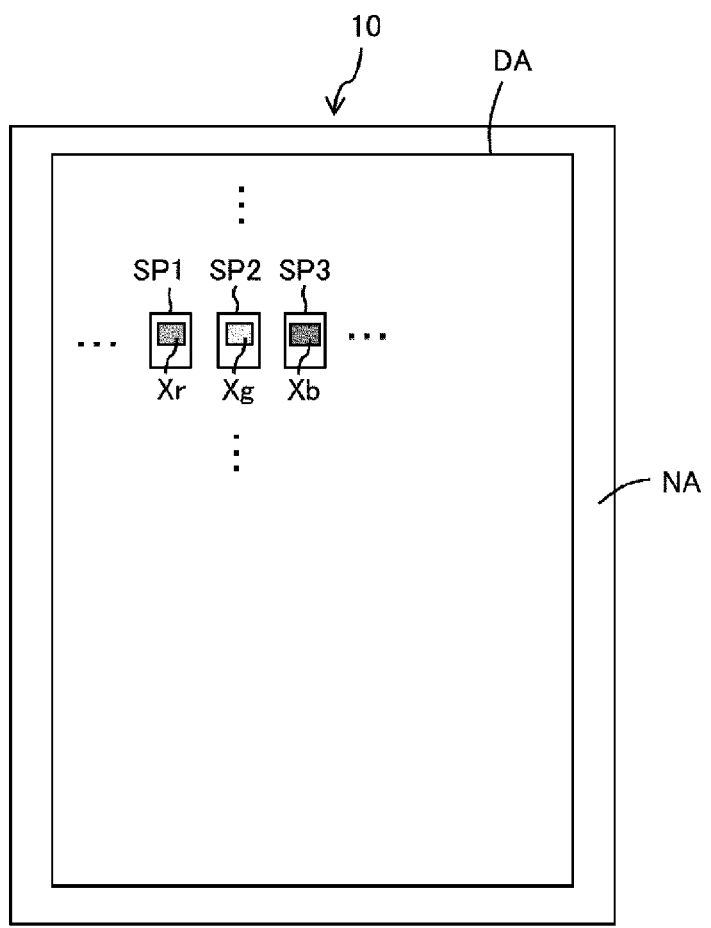
FIG. 5 is a plan view illustrating a configuration example of a display device of Example 1.

FIG. 5 is a plan view illustrating a configuration example of a display device of Example 1. A display region DA of a display device 10 is provided with a subpixel SP1 including a light-emitting element Xr configured to emit red light, a subpixel SP2 including a light-emitting element Xg configured to emit green light, and a subpixel SP3 including a light-emitting element Xb configured to emit blue light. A frame region NA surrounding the display region DA is provided with a terminal section, various drivers, and the like.

FIG. 6(a) is a cross-sectional view illustrating the configuration of the display device of Example 1, and FIGS. 6(b) to 6(d) are cross-sectional views each illustrating a configuration of an electron transport layer of a light-emitting element.

In the display device 10, a thin film transistor (TFT) layer 11, an anode Ad (pixel electrode), an edge cover film 23, a hole transport layer HT, a light-emitting layer (EMr, EMg, and EMb), an electron transport layer (25r, 25 g, and 25b), a cathode Kd, and a sealing layer 30 are formed in that order on a substrate 12.

A glass substrate or a flexible base material mainly containing resin such as polyimide may be used for the substrate 12. The top layer of the substrate 12 may be a barrier layer configured to block foreign matter such as water and oxygen.

In the TFT layer 11, a gate electrode 14, a gate insulating film 16, a semiconductor layer 17, conduction electrodes 19x and 19y, and an interlayer insulating film 21 are formed. The gate electrode 14 and the conduction electrodes 19x and 19y are each constituted of a single-layer film or multi-layer film of metal containing at least one of aluminum, tungsten, molybdenum, tantalum, chromium, titanium, and copper, for example. The gate insulating film 16 may be constituted of a silicon oxide film or silicon nitride film formed by using CVD, or a layered film of these films, for example.

The semiconductor layer 17 is an oxide semiconductor or polysilicon (LTPS), and a transistor Tr is constituted in such a manner as to include the gate electrode 14, the gate insulating film 16, the semiconductor layer 17, and the conduction electrodes 19x and 19y. The interlayer insulating film 21 is a flattening film, and may be formed of, for example, an organic material usable for coating polyimide, acrylic resin, or the like.

A plurality of the anodes Ad connected to different transistors Tr are formed on the interlayer insulating film 21. The plurality of anodes Ad are each formed in an island shape, and the circumferential end portion thereof is covered by the edge cover film 23, but the non-circumferential end portion is exposed (not covered by the edge cover film 23). The anode Ad is an optical reflective electrode and is constituted by layering ITO and silver (Ag) or an alloy containing Ag, for example.

The edge cover film 23 is formed by applying an organic material such as polyimide or an acrylic resin and then patterning the organic material by photolithography, for example. The hole transport layer HT is provided common to the light-emitting elements Xr, Xg, and Xb in such a manner as to cover the non-circumferential end portion of each anode Ad and the edge cover film 23.

In the light-emitting element Xr, the light-emitting layer EMr, a first layer L1r of the electron transport layer 25r, a second layer L2 of the electron transport layer 25r, and the cathode Kd are provided on the hole transport layer HT in that order. In the light-emitting element Xg, the light-emitting layer EMg, a first layer L1g of the electron transport layer 25 g, a second layer L2 of the electron transport layer 25 g, and the cathode Kd are provided on the hole transport layer HT in that order. In the light-emitting element Xb, the light-emitting layer EMb, a first layer L1b of the electron transport layer 25b, a second layer L2 of the electron transport layer 25b, and the cathode Kd are provided on the hole transport layer HT in that order. The cathode Kd is constituted by a metal thin film formed of aluminum, a magnesium-silver alloy, or the like, and has optical transparency.

The light-emitting layer EMr is a quantum dot layer configured to emit red light, the light-emitting layer EMg is a quantum dot layer configured to emit green light, and the light-emitting layer EMb is a quantum dot layer configured to emit blue light; the level of the lower end of the conduction band is shallower (closer to the vacuum level) and the barrier from the Fermi level of the cathode Kd is larger in the order of the light-emitting layer EMr, light-emitting layer EMg, and light-emitting layer EMb.

In FIG. 6, the first layer L1r of the electron transport layer 25r, the first layer L1g of the electron transport layer 25g, and the first layer L1b of the electron transport layer 25b each include semiconductor nanoparticles NP, and there is a relation of (the particle size of the nanoparticle NP of the first layer L1r of the electron transport layer 25r)>(the particle size of the nanoparticle NP of the first layer L1g of the electron transport layer 25g)>(the particle size of the nanoparticle NP of the first layer L1b of the electron transport layer 25b). The second layer L2 common to the electron transport layers 25r, 25g, and 25b includes the nanoparticles NP, and there is a relation of (the particle size of the second layer L2 of the electron transport layers 25r, 25g, and 25b)>(the particle size of the nanoparticle NP of the first layer L1r of the electron transport layer 25r).

As described above, the electron transport layer 25r is constituted by the first layer L1r and the second layer L2, and by reducing the interlayer barrier, the electron transportability of the electron transport layer 25r is improved, and the electron injection efficiency into the light-emitting layer EMr is improved. The electron transport layer 25g is constituted by the first layer L1g and the second layer L2, and the interlayer barrier is reduced, and thus the electron transportability of the electron transport layer 25g is improved, and the electron injection efficiency into the light-emitting layer EMg is improved. The electron transport layer 25b is constituted by the first layer L1b and the second layer L2, and the interlayer barrier is reduced, and thus the electron transportability of the electron transport layer 25b is improved, and the electron injection efficiency into the light-emitting layer EMb is improved.

FIG. 7 is a table showing a configuration example of Example 1. In FIG. 7, cadmium selenium (CdSe) is used for the light-emitting layer EMr, the light-emitting layer EMg, and the light-emitting layer EMb; the particle sizes of the quantum dots are set to have a relation of the size in the light-emitting layer EMr>the size in the light-emitting layer EMg>the size in the light-emitting layer EMb; the level of the lower end of the conduction band of the light-emitting layer EMr is set to be −3.4 eV, the level of the lower end of the conduction band of the light-emitting layer EMg is set to be −3.1 eV, and the level of the lower end of the conduction band of the light-emitting layer EMb is set to be −2.7 eV; ZnO nanoparticles (NPs) are used for the electron transport layers 25r, 25g, and 25b; and aluminum (Fermi level: −4.3 eV) is used for the cathode Kd.

In this case, when the NP particle size of the first layer L1r of the electron transport layer 25r is 1.7 nm, the levels of lower ends of the conduction bands of the first layer L1r and the light-emitting layer EMr are equivalent to each other; when the NP particle size of the first layer L1g of the electron transport layer 25g is 1.4 nm, the levels of the lower ends of the conduction bands of the first layer L1g and the light-emitting layer EMg are equivalent to each other; and when the NP particle size of the first layer L1b of the electron transport layer 25b is 1.15 nm, the levels of the lower ends of the conduction bands of the first layer L1b and the light-emitting layer EMb are equivalent to each other. The NP particle size of the second layer L2 common to the electron transport layers 25r, 25 g, and 25b is set to be 10 nm (level of lower end of conduction band: −4.0 eV), for example.

FIG. 8 illustrates cross-sectional views depicting a modified example of Example 1. It is preferable that a change of the lower end of the conduction band in the electron transport layer 25b (4.0–2.7=1.3), a change of the lower end of the conduction band in the electron transport layer 25g (4.0–3.1=0.9), and a change of the lower end of the conduction band in the electron transport layer 25r (4.0–3.4=0.6) be equal in terms of an inclination of the change in a film thickness direction.

Then, as illustrated in FIG. 8, regarding the electron transport layer 25r, the first layer L1r and the second layer L2 may be layered from the light-emitting layer EMr side; regarding the electron transport layer 25g, the first layer L1g, an intermediate layer Ld, and the second layer L2 may be layered from the light-emitting layer EMg side; and regarding the electron transport layer 25b, the first layer L1b, an intermediate layer Lc, the intermediate layer Ld, and the second layer L2 may be layered from the light-emitting layer EMb side. In this case, a relation of (the particle size of the nanoparticle NP of the first layer L1b)<(the particle size of the nanoparticle NP of the first layer L1g=the particle size of the nanoparticle NP of the intermediate layer Lc)< (the particle size of the nanoparticle NP of the first layer L1r=the particle size of the nanoparticle NP of the intermediate layer Ld)<(the particle size of the nanoparticle NP of the second layer L2) is satisfied, and a relation of the thickness of the electron transport layer 25r (for example, 30 nm)<the thickness of the electron transport layer 25g<the thickness of the electron transport layer 25b (for example, 66 nm) is satisfied.

FIG. 9(a) is a cross-sectional view illustrating a further modified example of Example 1, and FIGS. 9(b) to 9(d) are cross-sectional views each illustrating a configuration of an electron transport layer of a light-emitting element. In FIG. 6, in each of the light-emitting elements Xr, Xg, and Xb, the electron transport layer is constituted of a plurality of layers having different particle sizes, but is not limited thereto. As illustrated in FIG. 9, only in the light-emitting element Xb, where the CBM of the light-emitting layer is shallowest, the electron transport layer 25b may be constituted of a plurality of the layers (L1b and L2) having different particle sizes, and in each of the light-emitting elements Xr and Xg, the electron transport layer may be constituted of a single layer.

In this case, the second layer L2 of the electron transport layer 25r, the electron transport layer 25g, and the electron transport layer 25b may be a common layer (the particle sizes of the nanoparticles NP are the same). A relation of (the particle size of the nanoparticle NP of the first layer L1b of the electron transport layer 25b)<(the particle size of the nanoparticle NP of the second layer L2 of the electron transport layer 25b=the particle size of the nanoparticle NP of the electron transport layer 25g=the particle size of the nanoparticle NP of the electron transport layer 25r) is satisfied.

FIG. 10(a) is a cross-sectional view illustrating a further modified example of Example 1, and FIGS. 10(b) to 10(d) are cross-sectional views each illustrating a configuration of an electron transport layer of a light-emitting element. In FIG. 6, in each of the light-emitting elements Xr, Xg, and Xb, the anode Ad serves as an electrode at the lower layer side (a pixel electrode connected to a transistor), but the constitution of the electrode is not limited thereto. As illustrated in FIG. 10, the cathode Kd may serve as an electrode at the lower layer side (a pixel electrode connected to a transistor).

Second Embodiment

FIG. 11(a) is a cross-sectional view illustrating a configuration of a light-emitting element of a second embodiment, and FIGS. 11(b) and 11(c) are cross-sectional views each illustrating a configuration of an electron transport layer of the light-emitting element. As illustrated in FIGS. 11(a) to 11(c), a light-emitting element X of the second embodiment includes an anode Ad, a cathode Kd, a light-emitting layer EM disposed between the anode Ad and the cathode Kd, and a hole transport layer HT disposed between the anode Ad and the light-emitting layer EM. The hole transport layer HT includes a first layer H1 and a second layer H2 closer to the anode Ad relative to the first layer H1, the first layer H1 and the second layer H2 include nanoparticles NP formed of the same semiconductor, and a particle size of the nanoparticle NP of the second layer H2 is larger than a particle size of the nanoparticle NP of the first layer H1. In other words, the hole transport layer HT is provided with a plurality of layers including the first layer H1 and the second layer H2, each of the plurality of layers includes the nanoparticles NP formed of semiconductors, and the layer closer to the anode Ad includes the nanoparticle NP of a larger particle size.

In the semiconductor nanoparticles (particles of the order of nanometers in size) NP, the quantum size effect occurs as the particle size decreases, and an effect of an increase in band gap is obtained. In a p-type semiconductor nanoparticle NP, since the effective mass of a positive hole is small compared to an electron, a level change (change toward a deeper level) of the upper end of the valence band is larger than a level change (change toward a shallower level) of the lower end of the conduction band when the particle size is reduced to increase the band gap. Because of this, it is useful to apply a p-type semiconductor nanoparticle to the hole transport layer and change the particle size of the nanoparticle, for adjusting the hole injection level and the Fermi level.

In relation to the Fermi level accompanying the particle size change, it is unlikely that the quantity of acceptors changes significantly caused by the particle size change. Because of this, a difference between the level of the upper end of the valence band and the Fermi level may be considered substantially constant, where the difference is a factor that determines the carrier density. Accordingly, the Fermi level may be considered to become deeper at the same energy width as the level change of the upper end of the valence band accompanying the decrease of the particle size.

As the material of the nanoparticle NP of the hole transport layer HT, a material in which the effective mass of an electron is larger than that of a positive hole in the bulk state is suitable; an oxide containing at least one of Ni, Cr, Cu, and Fe may be preferable, or a compound containing at least one of Cu, Ag and Au, and at least one of SCN, SeCN, and CN may be preferable. Specifically, a compound containing at least one of NiO, $Cr_2O_3$, CuO and CuSCN, or the like is preferable.

In principle, as the particle size is smaller, the level of the upper end of the valence band and the Fermi level can be made deeper, but it is desirable for the diameter to be not less than 1 nm due to the manufacturing restrictions in an attempt to cause the particle size distribution of the nanoparticles NP to fall within a practical range.

The level of a lower end of a conduction band of the hole transport layer HT is substantially constant or becomes shallower as the band gap increases due to the reduction in particle size, and thus the electrons injected from an electron transport layer 25 into the light-emitting layer EM may be efficiently confined in the light-emitting layer EM by disposing the nanoparticles NP having a small particle size on the light-emitting layer EM side.

In the light-emitting layer EM, the positive holes and the electrons are recombined by a drive current between the anode Ad and the cathode Kd, and light is emitted while an exciton generated by the recombination transitions from the conduction band level to the valence band level of the quantum dot.

Figure 12:
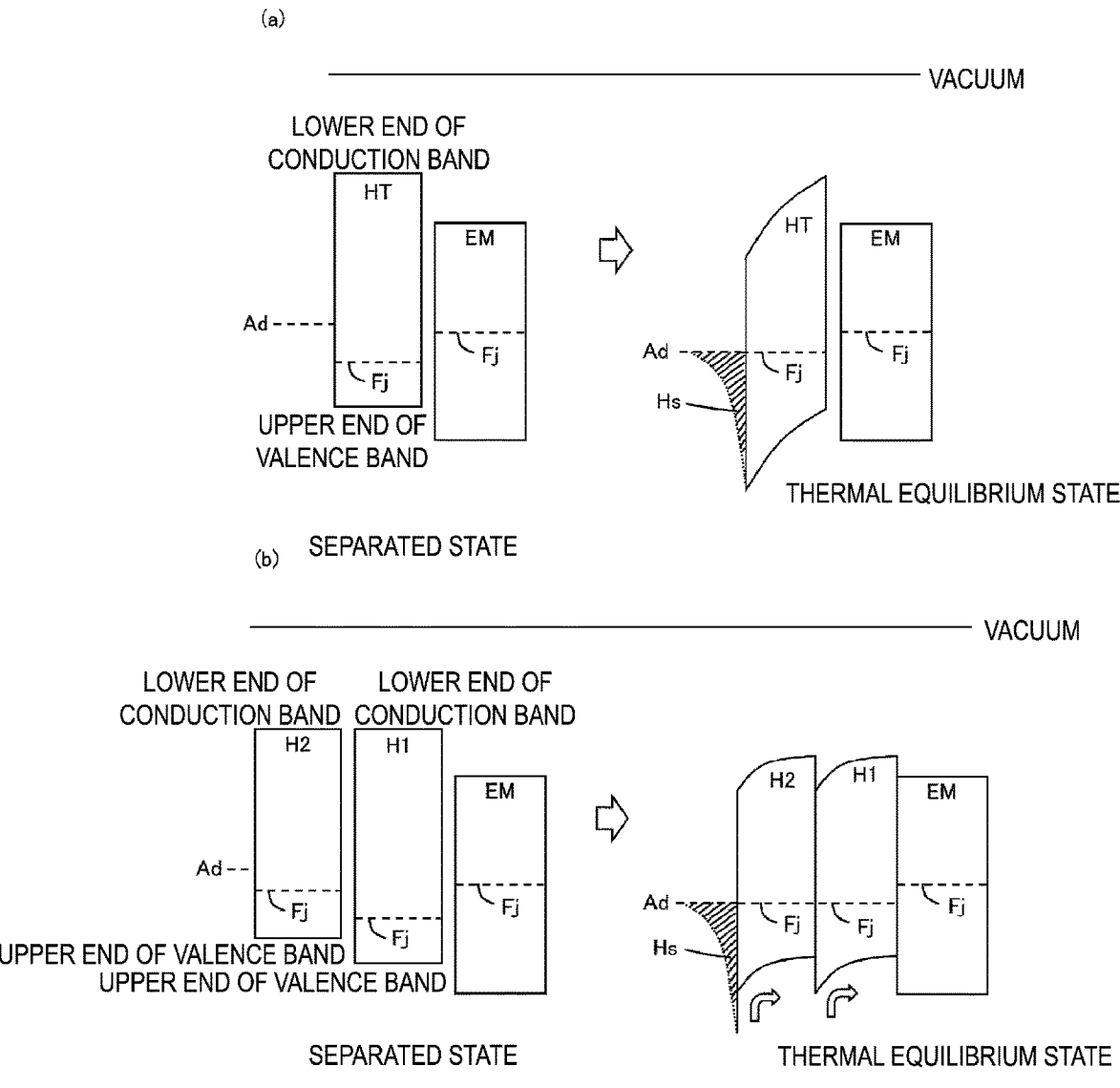
FIG. 12(a) is an energy level diagram of a comparative example.
FIG. 12(b) is an energy level diagram of the second embodiment.

FIG. 12(a) is an energy level diagram of a comparative example, and FIG. 12(b) is an energy level diagram of the second embodiment. As illustrated in FIG. 12(a), when the anode Ad, the hole transport layer HT, and the light-emitting layer EM are bonded, the band bends to match Fermi levels Fj of the hole transport layer HT (for example, NiO) and the anode Ad. At this time, the height of a barrier between the anode Ad and the hole transport layer HT is a difference between the level of the upper end of the valence band of the hole transport layer HT and a work function of the anode Ad. Not all of the positive holes of the anode Ad have a single energy level, and the positive holes thereof actually have an exponential function-type energy distribution Hs due to the effect of heat. In a comparative example (see FIG. 12(a)) in which the particle size of the nanoparticles in the hole transport layer HT is uniformed, because the barrier between the anode Ad and the hole transport layer HT is too high for the energy distribution Hs of the positive holes in the anode Ad, the positive holes hardly move.

On the other hand, in FIG. 12(b), in a state in which the first layer H1 and the second layer H2 are separated, a difference between the level of the upper end of the valence band of the first layer H1 and the level of the lower end of the conduction band of the first layer H1 is greater than a difference between the level of the upper end of the valence band of the second layer H2 and the level of the lower end of the conduction band of the second layer H2. In the state in which the first layer H1 and the second layer H2 are separated, the level of the upper end of the valence band of the first layer H1 is deeper than the level of the upper end of the valence band of the second layer H2, and the level of the lower end of the conduction band of the first layer H1 is equivalent to the level of the lower end of the conduction band of the second layer H2. In the state in which the first layer H1 and the second layer H2 are separated, the Fermi level Fj of the first layer H1 is deeper than the Fermi level Fj of the second layer H2. When the bonded first and second layers H1 and H2 are in a thermal equilibrium state, the Fermi level Fj of the first layer H1 and the Fermi level Fj of the second layer H2 match each other. With regard to bonding the light-emitting layer EM and the hole transport layer HT, because electrical conductivity of a quantum dot layer is significantly low, electrons and positive holes are unlikely to flow into the quantum dot layer, so that the Fermi levels Fj are not matched, and the bonding is made at a level as it is. At this time, the barrier from the hole transport layer HT to the light-emitting layer EM is a difference between a HOMO of the light-emitting layer EM and a level of the upper end of the valence band of the hole transport layer HT or the first layer H1 in a state before bonding.

In FIG. 11(b) and FIG. 12(b), the hole transport layer HT is provided with the first layer H1 including the semiconductor nanoparticles, and the second layer H2 located on the anode side relative to the first layer H1 and including the semiconductor nanoparticles having a larger particle size than that of the first layer H1 (having a smaller band gap than the first layer H1), and thus an interlayer barrier becomes small and the quantity of positive holes moving from the anode Ad to the hole transport layer HT increases as compared to the case of FIG. 12(a) of the comparative example. In other words, the efficiency of the hole injection is improved.

In FIG. 11(c), the anode Ad, the second layer H2, the fourth layer H4 including the semiconductor nanoparticles, the third layer H3 including the semiconductor nanoparticles, the first layer H1, and the light-emitting layer EM are disposed in that order, and a relation of the particle size of the first layer H1<the particle size of the third layer H3<the particle size of the fourth layer H4<the particle size of the second layer H2 is satisfied. As described above, as the number of layers in the hole transport layer HT is increased, the interlayer barrier becomes smaller, so that the transport properties of the positive holes in the hole transport layer HT are improved and the efficiency of the positive hole injection is improved.

The embodiments described above are for the purpose of illustration and description and are not intended to be limiting. It will be apparent to those skilled in the art that many variations will be possible in accordance with these examples and descriptions.

The invention claimed is:

1. A display device, comprising:
a first light-emitting element configured to emit red light;
a second light-emitting element configured to emit green light; and
a third light-emitting element configured to emit blue light,
wherein each of the first, second, and third light-emitting elements includes:
an anode,
a cathode,
a light-emitting layer disposed between the anode and the cathode, and
an electron transport layer disposed between the cathode and the light-emitting layer, and including a first layer and a second layer closer to the cathode relative to the first layer,
in each of the first, second, and third light-emitting elements, the first layer and the second layer include nanoparticles containing an identical semiconductor, and a particle size of each nanoparticle of the second layer is larger than a particle size of each nanoparticle of the first layer, and
the particle size of each nanoparticle included in the first layer of the first light-emitting element is larger than the particle size of each nanoparticle included in the first layer of the second light-emitting element, and the particle size of each nanoparticle included in the first layer of the second light-emitting element is larger than the particle size of each nanoparticle included in the first layer of the third light-emitting element.

2. The display device according to claim 1,
wherein the second layer of the first light-emitting element, the second layer of the second light-emitting element, and the second layer of the third light-emitting element form a common layer.

3. The display device according to claim 1,
wherein, in each of the first, second, and third light-emitting elements, the first layer and the light-emitting layer are in contact with each other, and the second layer and the cathode are in contact with each other, and
the particle size of each nanoparticle included in the second layer of the first light-emitting element, the particle size of each nanoparticle included in the second layer of the second light-emitting element, and the particle size of each nanoparticle included in the second layer of the third light-emitting element are equivalent to one another.

4. The display device according to claim 1, wherein a thickness of the electron transport layer of the first light-emitting element is less than a thickness of the electron transport layer of the second light-emitting element, and the thickness of the electron transport layer of the second light-emitting element is less than a thickness of the electron transport layer of the third light-emitting element.

* * * * *